United States Patent
Weber

(10) Patent No.: US 8,928,972 B2
(45) Date of Patent: Jan. 6, 2015

(54) REFLECTIVE OPTICAL ELEMENT FOR EUV LITHOGRAPHY

(75) Inventor: Joern Weber, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/188,692

(22) Filed: Jul. 22, 2011

(65) Prior Publication Data

US 2012/0013976 A1 Jan. 19, 2012

Related U.S. Application Data

(63) Continuation-in-part of application No. PCT/EP2010/069553, filed on Dec. 13, 2010.

(30) Foreign Application Priority Data

Dec. 15, 2009 (DE) .......................... 10 2009 054 653

(51) Int. Cl.
*G02B 5/08* (2006.01)
*G21K 1/06* (2006.01)
*G02B 1/10* (2006.01)
*G03F 7/20* (2006.01)
*B82Y 30/00* (2011.01)

(52) U.S. Cl.
CPC .............. *G02B 5/0891* (2013.01); *G02B 1/105* (2013.01); *G02B 5/0816* (2013.01); *G03F 7/70233* (2013.01); *G03F 7/70316* (2013.01); *G03F 7/70958* (2013.01); *B82Y 30/00* (2013.01)
USPC .............................. 359/360; 378/34; 359/585

(58) Field of Classification Search
CPC ........ G02B 5/208; G02B 5/282; G02B 5/285; G02B 1/115; G21K 1/062; G03F 7/702

USPC ................................................... 359/359, 360
See application file for complete search history.

(56) References Cited

U.S. PATENT DOCUMENTS 6,011,646 A 1/2000 Mirkarimi et al.
6,042,929 A * 3/2000 Burke et al. .................. 428/141

(Continued)

FOREIGN PATENT DOCUMENTS

DE 102004062289 A1 7/2006
EP 1387189 A2 2/2004

(Continued)

OTHER PUBLICATIONS

Hiroshi Nagata "Nickel/Vanadium and Nickel/Titanium Multilayers for X-Ray Optics," Jun. 1990, Japanese J. of Applied Physics 29, 1215-1219.*

(Continued)

*Primary Examiner* — Thomas K Pham
*Assistant Examiner* — Marin Pichler
(74) *Attorney, Agent, or Firm* — Edell, Shapiro & Finnan, LLC

(57) ABSTRACT

A stress-reduced reflective optical element for a working wavelength in the soft X-ray and extreme ultraviolet wavelength range includes a first multilayer system (4) of at least two alternating materials (41, 42) having different real parts of the refractive index at the working wavelength on a substrate (2), which exerts a layer stress on the substrate (2), and comprising a second multilayer system (6) of at least two alternating materials (61, 62) on a substrate (2), which exerts an opposed layer stress on the substrate (2) and is arranged between the first multilayer system (4) and the substrate (2), wherein one of the materials (61) of the second multilayer system (6) is nickel-vanadium-silicon, and wherein the ratio (G) of the overall thickness of nickel-vanadium-silicon layers (61) within one period (60) of the second multilayer system (6) to the overall thickness of the period (60) of the second multilayer system (6) is at least 0.25.

20 Claims, 4 Drawing Sheets

(56) References Cited

U.S. PATENT DOCUMENTS

| | | | |
|---|---|---|---|
| 6,134,049 | A | 10/2000 | Spiller et al. |
| 6,183,409 | B1 * | 2/2001 | Armini .............................. 600/3 |
| 6,228,512 | B1 | 5/2001 | Bajt et al. |
| 7,203,275 | B2 * | 4/2007 | Shiraishi ......................... 378/84 |
| 2001/0019803 | A1 | 9/2001 | Mirkanimi |
| 2003/0214736 | A1 | 11/2003 | Yoshikawa et al. |
| 2004/0063004 | A1 | 4/2004 | Alkemper et al. |
| 2004/0254418 | A1 * | 12/2004 | Munro et al. ..................... 600/8 |
| 2008/0088916 | A1 | 4/2008 | Benoit et al. |
| 2009/0051026 | A1 * | 2/2009 | Chey et al. .................... 257/712 |
| 2011/0228234 | A1 | 9/2011 | Von Blanckenhagen |

FOREIGN PATENT DOCUMENTS

| | | | |
|---|---|---|---|
| JP | 2003515794 | A | 5/2003 |
| JP | 2006226733 | A | 8/2006 |
| JP | 2007140147 | A | 6/2007 |
| JP | 4356696 | B2 | 11/2009 |
| WO | WO 2005114266 | A1 | 12/2005 |

OTHER PUBLICATIONS

M. G. Pelizzo et al., "High performance EUV multilayer structures insensitive to capping layer optical parameters," Sep. 15, 2008, OSA, Optics Express, 16, 15228-15237.*

Mandeep Singh et al., "Design of multilayer extreme-ultraviolet mirrors for enhanced reflectivity," May 1, 2000, OSA, Appl. Optics, 39, 2189-2198.*

Dietsch R. et al: "Evolution of Stress and Microstructure in Ni/C multilayers used as X-ray optics in a wide energy range", Proceedings of the SPIE—The International Society for Optical Engineering, USA, vol. 4501, Jul. 30, 2001, pp. 118-126.

Mirkarimi P. B. et al: "Advances in the Reduction and Compensation of Film Stress in High-Reflectance Multilayer Coatings for Extreme Ultraviolet Lithography", Proceedings of SPIE, SPIE, USA, vol. 3331, Feb. 23, 1998, pp. 133-148.

Mirkarimi P.B. "Stress, reflectance, and temporal stability of sputter-deposited Mo/Si and Mo/Be multilayer films for extreme ultraviolet lithography", Opt. Eng. 38(7), p. 1246-1259, Jul. 1999.

Office Action in corresponding Japanese Application No. 2012-543669, dated Jul. 1, 2014, along with an English translation.

* cited by examiner

REFLECTIVE OPTICAL ELEMENT FOR EUV LITHOGRAPHY

CROSS-REFERENCE TO RELATED PATENT APPLICATIONS

This is a Continuation-in-part of International Application PCT/EP2010/069553, with an international filing date of Dec. 13, 2010, which was published under PCT Article 21(2) in English, which claims priority under 35 U.S.C. §119(a) to German Patent Application No. 10 2009 054 653.7, filed on Dec. 15, 2009, the entire contents of which are hereby incorporated by reference.

FIELD AND BACKGROUND

The present invention relates to reflective optical elements for a working wavelength in the soft X-ray and extreme ultraviolet wavelength ranges, in particular for use in an EUV lithography apparatus comprising a first multilayer system of at least two alternating materials having different real parts of the refractive index at the working wavelength on a substrate, which exerts a layer stress on the substrate, and comprising a second multilayer system of at least two materials, periodically alternating, as the case may be, on a substrate, which exerts an opposed layer stress and is arranged between the first multilayer system and the substrate. Moreover, the present invention relates to a projection system, in particular for an EUV lithography apparatus, comprising at least one of the above-mentioned reflective optical elements, an illumination system, in particular for an EUV apparatus, comprising at least one of the above-mentioned reflective optical elements, a beam-shaping system, in particular for an EUV lithography apparatus, comprising at least one of the above-mentioned reflective optical elements, and an EUV lithography apparatus, comprising at least one of the above-mentioned reflective optical elements.

In EUV lithography apparatuses, reflective optical elements for the extreme ultraviolet (EUV), or soft X-ray wavelength range (e.g. wavelengths between about 5 nm and 20 nm), such as photomasks or mirrors, are used for the lithographic processing of semiconductor components. Since EUV lithography apparatuses usually have a plurality of reflective optical elements, they must have the highest possible reflectivity in order to ensure sufficient overall reflectivity. Since a plurality of reflective optical elements are usually arranged in series in an EUV lithography apparatus, the slightest deterioration in reflectivity of each individual reflective optical element has a substantial effect on the overall reflectivity within the EUV lithography apparatus.

Reflective optical elements for the EUV and soft X-ray wavelength range, usually comprise highly reflective coatings in the form of multilayer systems. These are alternately applied layers of a material having a higher real part of the refractive index at the working wavelength (also referred to as spacer) and a material having a lower real part of the refractive index at the working wavelength (also referred to as absorber), wherein an absorber-spacer pair forms a stack, or a period. This essentially simulates a crystal, wherein its lattice planes correspond to the absorber layers, on which Bragg reflection occurs. The thicknesses of the individual layers as well as the repetitive stacks can be constant across the entire multilayer system, or they can vary depending on which reflection profile is to be achieved.

As early as during the coating process, a stress can build up within a multilayer system, which has an effect on the underlying substrate and deforms it to an extent that the optical imaging on the corresponding reflective optical element is substantially interfered with. The type of stress depends, amongst other things, on the materials used as the spacer and the absorber and the thickness ratios present within a stack, or a period. Usually, between the highly reflective multilayer system and the substrate, an interposed coating is provided, which has a layer stress opposed to the one exerted by the reflective multilayer system and which can also be formed as a multilayer system of alternating layers of different materials.

OBJECT

It is an object of the present invention to provide reflective optical elements for working wavelengths in the soft X-ray and extreme ultraviolet wavelength ranges, wherein a stress resulting from a highly reflective coating can be reduced.

SUMMARY

This object is achieved by a reflective optical element for a working wavelength in the soft X-ray and extreme ultraviolet wavelength ranges, in particular for use in an EUV lithography apparatus, comprising a first multilayer system of at least two alternating materials having different real parts of the refractive index at the working wavelength on a substrate, which exerts a layer stress on the substrate, and comprising a second multilayer system of at least two alternating materials on a substrate, which exerts an opposed layer stress on the substrate and is arranged between the first multilayer system and the substrate, wherein a first of the at least two materials of the second multilayer system is interrupted by a layer having a thickness of up to 1 nm of the at least one further material of the second multilayer system at such distances that the first material is present in an amorphous state.

It is well known that, starting from certain layer thicknesses, which depend on the layer material and the coating method used, the layer in question starts to have crystallites. As the layer thickness is increased, the crystallites grow to an extent, where the entire layer is in a crystalline state. This can lead to increased micro roughness of the surface of each layer, which can also continue into the layers on top of it. In the present case, it is suggested to select a material as the first material for the second multilayer system, which basically allows a layer stress to be achieved, which is opposed to the one exerted by the first multilayer system, and to insert within this material, as stopping layers, as it were, layers of one or more materials at such intervals, that when the first material is applied by standard coating methods such as sputtering or electron beam evaporation, which work at the usual energies of layer-forming particles of up to a maximum of 10 eV, it is present in an as amorphous state as possible, or has such a low crystallite content, that sufficiently low micro roughness of the layers of the first material can be maintained for EUV lithography. In particular, expensive special coating methods need not be resorted to, which work with highly energetic layer-forming particles of 40 eV and way above that, such as laser-pulsed coating methods. As a result, the layers of the first material are noticeably thicker than the thin layers having a crystallization-stopping effect.

Preferably, the root mean square roughness can be up to 0.25 nm, particularly preferably up to 0.20 nm. The root mean square (RMS) roughness is calculated from the mean of the squares of the deviation of the measuring points across the surface to a mean area that is placed in the surface in such a manner that the sum of the deviations is minimal as related to the mean area. In particular, with optical elements used for EUV lithography, the roughness in a spatial wavelength range from 0.1 µm to 200 µm is of particular importance to avoid negative effects on the optical properties of the optical elements.

Advantageously, the at least two materials of the second multilayer system are arranged in a periodic alternating fashion, and the ratio G of the overall thickness of layers of the first material within one period of the second multilayer system to the overall thickness of the period of the second multilayer system is greater than 0.80. With such a construction, it can be achieved that layer stress generated by the second multilayer system is primarily determined by the first material, while the thin layers act to prevent crystalline growth of the first material.

In preferred embodiments, the first material is selected from the group comprising molybdenum, nickel and nickel alloys. Preferred nickel alloys are, for example, nickel-silicon, nickel-boron, nickel-molybdenum, nickel-silicon-boron or nickel-vanadium. These materials are particularly suitable to compensate layer stresses caused by reflective multilayer systems as they are usually used for wavelengths in the EUV or soft X-ray wavelength range.

In further preferred embodiments the material(s) of the thin layers are selected from the group comprising boron carbide, carbon, silicon carbide, silicon nitride, silicon, chromium and combinations thereof. These materials are particularly suitable to be applied as thin layers.

Preferably, the thickness of the thin layers of the at least one further material is below 0.8 nm to keep the effect on the layer stress as small as possible. The thickness can be reduced to values so low that it can be referred to as local doping of the first material.

Moreover, the object is achieved by a reflective optical element for a working wavelength in the soft X-ray and extreme ultraviolet wavelength ranges, in particular for use in an EUV lithography apparatus, comprising a multilayer system of at least two alternating materials having different real parts of the refractive index at the working wavelength on a substrate, which exerts a layer stress on the substrate, and comprising a second multilayer system of at least two periodically alternating materials on a substrate, which exerts an opposed layer stress on the substrate and is arranged between the first multilayer system and the substrate, wherein one of the materials of the second multilayer systems is nickel or a nickel alloy, and wherein the ratio G of the overall thickness of nickel or nickel alloy layers within a period of the second multilayer system to the overall thickness of the period of the second multilayer system is at least 0.25.

It has been found that nickel and nickel alloys are particularly suitable to compensate layer stresses generated by reflective multilayer systems, which are optimized for wavelengths in the EUV range. Among others, nickel-silicon, nickel-boron, nickel-molybdenum, nickel-silicon-boron or nickel-vanadium, for example, are preferred. In preferred embodiments, the second multilayer system consists of periods of layers of nickel or a nickel alloy and at least two layers of the materials having different real parts of the refractive index at the working wavelength of the first multilayer system. The use of materials of the first multilayer system also in the second multilayer system enables the entire coating method to be simplified.

In further preferred embodiments, the second multilayer system consists of periods of two alternatingly arranged layers of two materials, one of which is nickel or a nickel alloy, and a layer of a third material, to achieve good stress compensation.

It has also been found advantageous for good stress compensation to build up the second multilayer system of periods of first layers of nickel or nickel alloys and second layers of a further metal.

Advantageously, the at least one further material of the second multilayer system is selected from the group comprising molybdenum, silicon, carbon, silicon nitride, chromium and any of their combinations. These materials have been found particularly suitable in combination with nickel or nickel alloys for the compensation of layer stresses of first multilayer systems suitable for wavelengths in the EUV or soft X-ray wavelength range.

The object is further achieved by a reflective optical element for a working wavelength in the soft X-ray and extreme ultraviolet wavelength ranges, in particular for use in an EUV lithography apparatus, comprising a first multilayer system of at least two alternating materials having different real parts of the refractive index at the working wavelength on a substrate, which exerts a layer stress on the substrate, and comprising a second multilayer system of at least two periodically alternating materials on a substrate, which exerts an opposed layer stress on the substrate and is arranged between the first multilayer system and the substrate, wherein one of the materials of the second multilayer system is nickel-vanadium-silicon, and wherein the ratio of the overall thickness of nickel-vanadium-silicon layers within one period of the second multilayer system to the overall thickness of the period of the second multilayer system is at least 0.25.

It has been found that the utilization of in particular the material nickel-vanadium-silicon in the second multilayer systems allows for both good compensation of stress induced by the first multilayer used for reflecting radiation of a wavelength in the soft X-ray and extreme ultraviolet wavelength range. Nickel-vanadium-silicon has in addition the advantage to absorb the radiation of the soft X-ray and extreme ultraviolet wavelength range and to thus protect the substrate under the multilayer systems from radiation damage.

Preferably, the second multilayer system is comprised of periods of first layers of nickel-vanadium-silicon and second layers of a further metal.

Advantageously, the further metal comprises molybdenum or chromium.

In preferred embodiments, the thickness of the nickel-vanadium-silicon layers is between 4.5 nm and 7.5 nm and the thickness of the metal layers is between 3.0 nm and 5.0 nm.

Preferably, the ratio of the overall thickness of nickel-vanadium-silicon layers within one period of the second multilayer system to the overall thickness of the period of the second multilayer system is between 0.45 and 0.75.

Advantageously, the second multilayer system comprises 40 to 50 periods.

In preferred embodiments, the nickel-vanadium-silicon comprises 33 wt.-% to 50 wt.-% of silicon.

Preferably, the nickel vanadium of the nickel-vanadium-silicon comprises between 90 wt.-% and 95 wt.-% nickel and between 10 wt.-% and 5 wt.-% vanadium.

One possibility of depositing layers of nickel-vanadium-silicon is e.g. sputtering while using two different targets, one made of nickel vanadium and the other made of silicon. This allows the deposition of nickel-vanadium-silicon layers with a defined concentration of vanadium and nickel as well as with a desired concentration of silicon.

Advantageously, the second multilayer system is comprised of periods of two materials arranged in alternating layers, one of which is nickel-vanadium-silicon, and a layer of a third material.

Furthermore, the object is achieved by a projection system, in particular for an EUV lithography apparatus comprising at least one of the above-mentioned reflective optical elements, by an illumination system, in particular for an EUV lithography apparatus, comprising at least one of the above-mentioned reflective optical elements, by a beam-shaping system, in particular for an EUV lithography apparatus, comprising at least one of the above-mentioned reflective optical elements, and by an EUV lithography apparatus comprising at least one of the above-mentioned reflective optical elements. Advantageous embodiments can be found in the dependent claims.

BRIEF DESCRIPTION OF THE DRAWINGS

The present invention will now be described with reference to a preferred exemplary embodiment in more detail, wherein.

DETAILED DESCRIPTION

Figure 1:
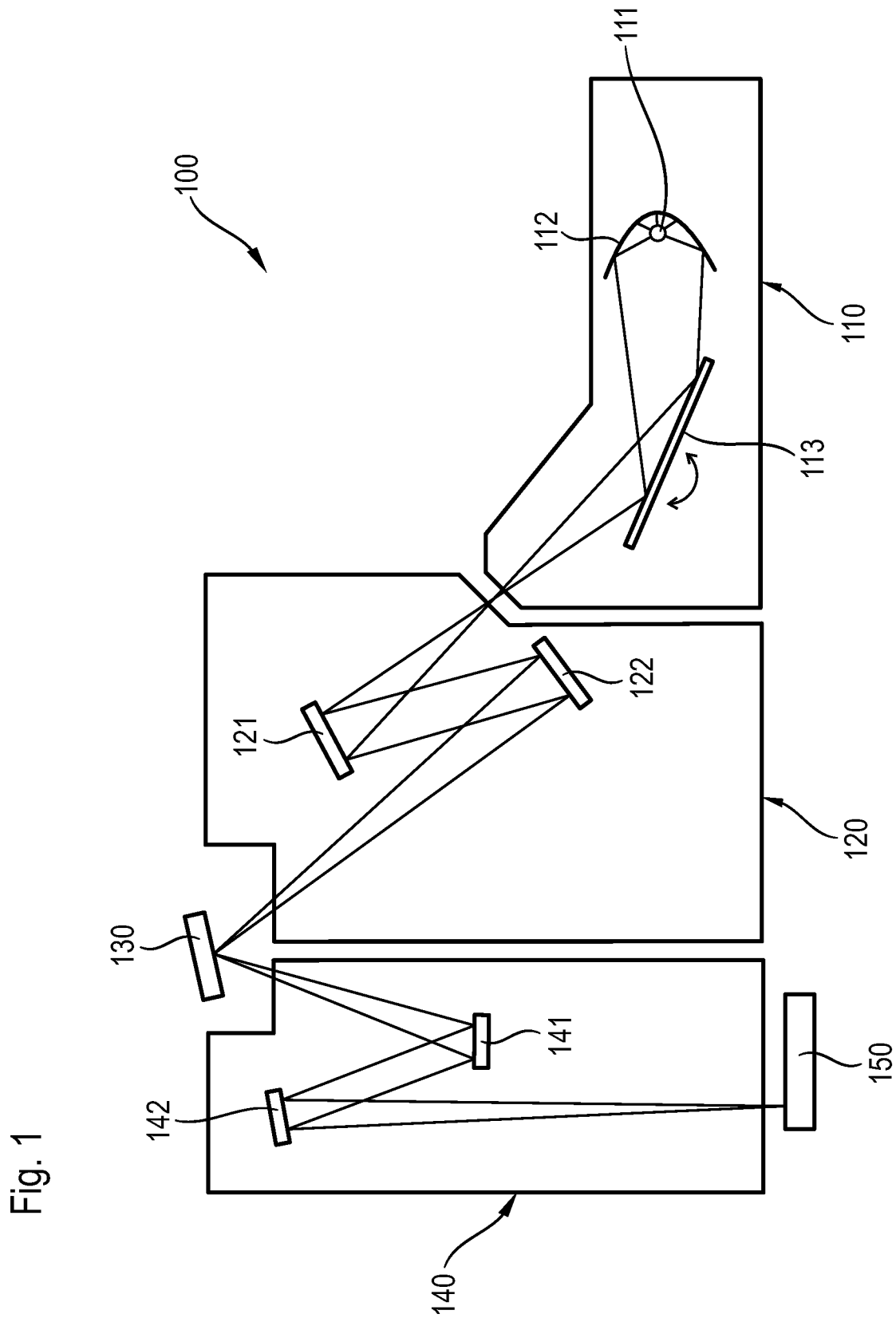
FIG. 1 schematically shows an embodiment of an EUV lithography apparatus.

FIG. 1 schematically shows an EUV lithography apparatus 100. Substantial components thereof are the beam-shaping system 110, the illumination system 120, the photomask 130, and the projection system 140.

A plasma source or even a synchrotron can serve, for example, as a radiation source 111. For the wavelength range from 5 nm to 12 nm, in particular, X-ray lasers (X-FEL) are also suitable as a radiation source. The radiation emitted is first focused by a collector mirror 112. Moreover, a monochromator 113 is used to filter out the operating wavelength by varying the angle of incidence. In the wavelength range mentioned, the collector mirror 112 and the monochromator 113 are usually formed as reflective optical elements having a multilayer system of at least two alternating materials with different real parts of the refractive index at the working wavelength in order to achieve reflection of the radiation of the working wavelength. Collector mirrors are usually dish-like reflective optical elements to achieve a focusing or collimating effect. Both collector mirror 112 and monochromator 113 can be formed as stress-reduced reflective optical elements, as will be described in detail below. Depending on the choice of radiation source and the structure of the collector mirror, a monochromator can also be dispensed with.

The operating beam processed in beam-shaping system 110 with respect to wavelength and spatial distribution is then fed into the illumination system 120. In variants of the EUV lithography apparatus 100, the beam-shaping system 110 can also be integrated in the illumination system 120. In the example shown in FIG. 1, illumination system 120 has two mirrors 121, 122, designed as stress-reduced reflective optical elements in the present example. Mirrors 121, 122 direct the beam onto photomask 130, which has the structure to be imaged onto wafer 150. Photomask 130 is also a reflective optical element for the EUV and soft wavelength range, which is exchanged depending on the manufacturing process. Projection system 140 is used to project the beam reflected by photomask 130 onto wafer 150 and thus to image the structure of the photomask onto the wafer. Projection system 140, in the example shown, has two mirrors 141, 142, which can also be stress-reduced reflective optical elements in the present example. It should be noted that both projection system 140 and illumination system 120 could also comprise only one, or three, four, five and more mirrors.

In the example shown in FIG. 1, all mirrors 121, 122, 141, 142 are stress-reduced reflective optical elements, as will be explained in more detail below. Optionally, photomask 130 could also be such a stress-reduced reflective optical element. It should be noted that only one or a number of the reflective optical elements could be stress-reduced reflective optical elements. Preferably, stress-reduced reflective optical elements are arranged in projection system 140, since good imaging properties are particularly important there.

FIGS. 2 to 6 schematically depict exemplary embodiments of different stress-reduced reflective optical elements 1 for the extreme ultraviolet and soft X-ray wavelength range, in particular for use in EUV lithography apparatuses, e.g. as mirrors of the projection or illumination system, or even as a photomask, collector mirror or monochromator. The reflective optical elements 1, in all the examples shown here, comprise a multilayer system 4 and a substrate 2.

Multilayer system 4, is essentially comprised of multiple repetitive stacks or periods 40. The essential layers 41, 42 of a period, which as a result of the multiple repetition of the periods 40, in particular, lead to sufficiently high reflection at a working wavelength, are so-called absorber layers 41 of a material having a lower real part of the refractive index and so-called spacer layers 42 of a material having a higher real part of the refractive index. This essentially imitates a crystal, wherein absorber layers 41 correspond to the lattice planes within the crystal, which have a distance from each other defined by each spacer layer 42 and on which reflection of the incident EUV or soft X-ray radiation occurs. The thicknesses of the layers are selected in such a manner that the radiation reflected on each absorber layer 41 constructively interferes at a certain working wavelength to thus achieve a high reflectivity of the reflective optical element. It should be noted that the thickness of the individual layers 41, 42 as well as of the repetitive stacks 40 can be constant across the entire multilayer system or can also vary depending on which reflection profile is to be achieved. In particular, multilayer systems can be optimized for a certain wavelength at which the maximum reflectivity and/or the reflected bandwidth is greater than with non-optimized multilayer systems. The respective reflective optical element 1 is used, for example, in EUV lithography with radiation of this wavelength, which is why this wavelength, for which the reflective optical element 1 has been optimized, is also referred to as the working wavelength.

A protective layer 3 to protect against external influences such as contamination, has been additionally applied on multilayer system 4 in the examples shown here, which can be comprised of several different material layers. Furthermore, intermediate layers, not shown here, could also be provided, which increase the thermodynamic and thermal stability of multilayer system 4, as diffusion barriers between the absorber and spacer layers.

All embodiments of a reflective optical element shown in FIGS. 2 to 6 include a second multilayer system 6 between the highly reflective first multilayer system 4 and the substrate 2, which serves to compensate as much as possible the layer stress caused by the first multilayer system 4 on the substrate 2. The second multilayer system 6, in the example shown here, is structured as periods 60 of alternating layers.

It should be noted that, for better clarity, only a very small number of periods 40, 60 is shown in the examples illustrated here. The number of periods 40 of the first multilayer system 4 is determined in each case, in particular, depending on the desired optical properties of first multilayer system 4. The number of periods 60 of the second multilayer system 6 is determined, in particular, depending on the layer stress of first multilayer system 4 to be compensated.

Figure 2:
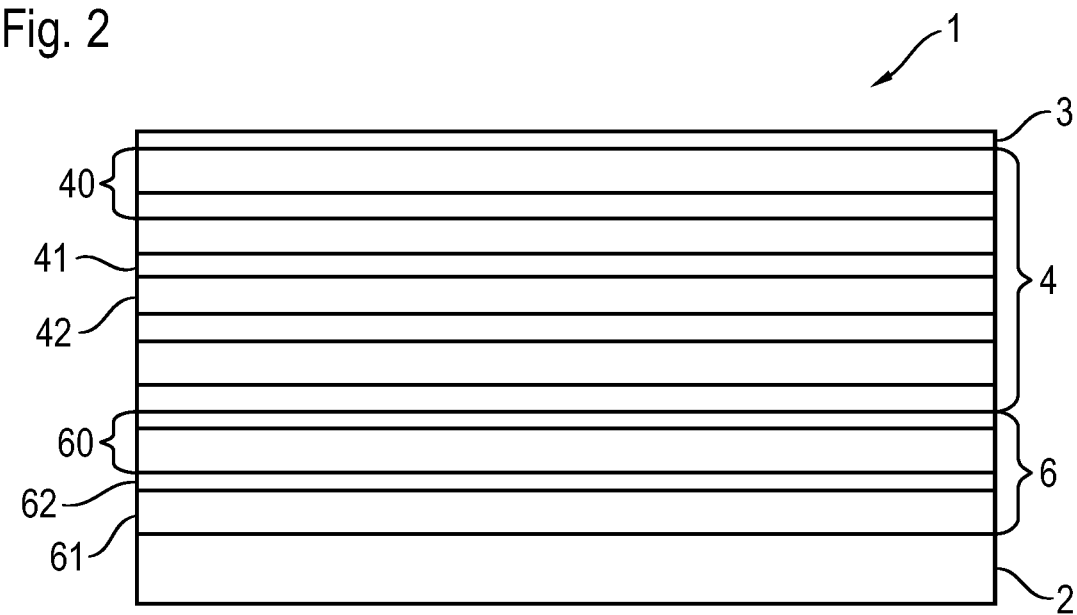
FIGS. 2 to 6 schematically show the structure of various embodiments of a reflective optical element.

In the example shown in FIG. 2, reflective optical element 1 has periods 60, each comprised of two materials 61, 62. Herein, layers 61 of a first material are interrupted by layers 62 having a thickness of up to 1 nm, preferably between 0.3 nm and 0.8 nm, so that the first material is interrupted at such intervals that the layers 61 of the first material are present in an amorphous state. In particular, the thickness of layers 61 of the first material is chosen such that the ratio G of the overall thickness of layers 61 of the first material within one period 60 to the overall thickness of the period 60 is greater than 0.80. Preferred materials for layers 61 in the embodiment illustrated in FIG. 2, are, for example, molybdenum, nickel or a nickel alloy. Preferred materials for layers 62 in the embodiment illustrated in FIG. 2, are, for example, boron carbide, carbon, silicon carbide, silicon, chromium or combinations thereof.

If, for example, the first multilayer system is comprised of alternating silicon layers as spacer layers 42 and molybdenum layers as absorber layers 41, with the structure of a period consisting of 4 nm silicon, 0.5 nm carbon as a diffusion barrier, and 2.4 nm molybdenum at a period number of 50, as it is suitable, for example, for a high reflection between 12 nm and 14 nm, its layer stress can be compensated, for example, by the following second multilayer system 60, amongst others:

In a first example on the basis of molybdenum as a first material of second multilayer system 6, a period 60 includes a molybdenum layer of 2.1 nm and a boron carbide layer of 0.5 nm, where 190 periods are needed.

In a second example on the basis of molybdenum as a first material of second multilayer system 6, a period 60 includes a molybdenum layer of 2.1 nm and a carbon layer of 0.5 nm, where 170 periods are needed.

In addition to boron carbide and carbon, for example, silicon, chromium, silicon carbide and silicon nitride are also suitable as materials for the layers, which are arranged—in the manner of stopping layers—between two molybdenum layers at such a distance that the molybdenum layers are present in an amorphous state. Nickel layers or layers of a nickel alloy could also be provided instead of molybdenum layers.

In a further example on the basis of nickel-vanadium as a first material of second multilayer system 6, a period 60 includes a nickel-vanadium layer of 2.7 nm and a carbon layer of 0.5 nm, where 85 periods are needed. As a modification of this example, nickel-silicon-boron could also be provided instead of nickel-vanadium, and chromium instead of carbon.

Thin layers of silicon, chromium, silicon nitride, silicon carbide or boron carbide, for example, could also be arranged instead of carbon between the thicker layers on the basis of nickel or a nickel alloy, such as nickel-silicon, nickel-boron, nickel-molybdenum, nickel-silicon-boron or nickel-vanadium, at such distances that these thicker layers are present in an amorphous state. Nickel-vanadium, in particular, has the advantage that even layers of 3.5 nm or more can be present in an amorphous state. The layer stress of the first multilayer system can also be compensated by second multilayer systems 6, for example, where a period 60 includes nickel-vanadium layers of a thickness between 3.5 nm and 10 nm and, for example, boron carbide or silicon carbide layers of a thickness between 0.5 nm and 2 nm, wherein between 100 and 350 periods are needed for boron carbide layers and 100 to 300 periods are needed for silicon carbide layers. Other nickel alloys or nickel are also present in an amorphous state at higher layer thicknesses.

It should be noted that the thicknesses of layers 62 serving as stopping layers could also be made thinner. To control the layer thicknesses during the coating process, it is advantageous, however, if the thickness is at least 0.3 nm to 0.4 nm, to be able to determine the actual layer thickness with good precision by using reflected radiation in the range of the working wavelength. It should also be noted that, both in the above-mentioned and the following examples, other nickel alloys or nickel could be used instead of nickel-vanadium for layers 61, in particular nickel-silicon, nickel-boron, nickel-molybdenum or nickel-silicon-boron.

Figure 3:
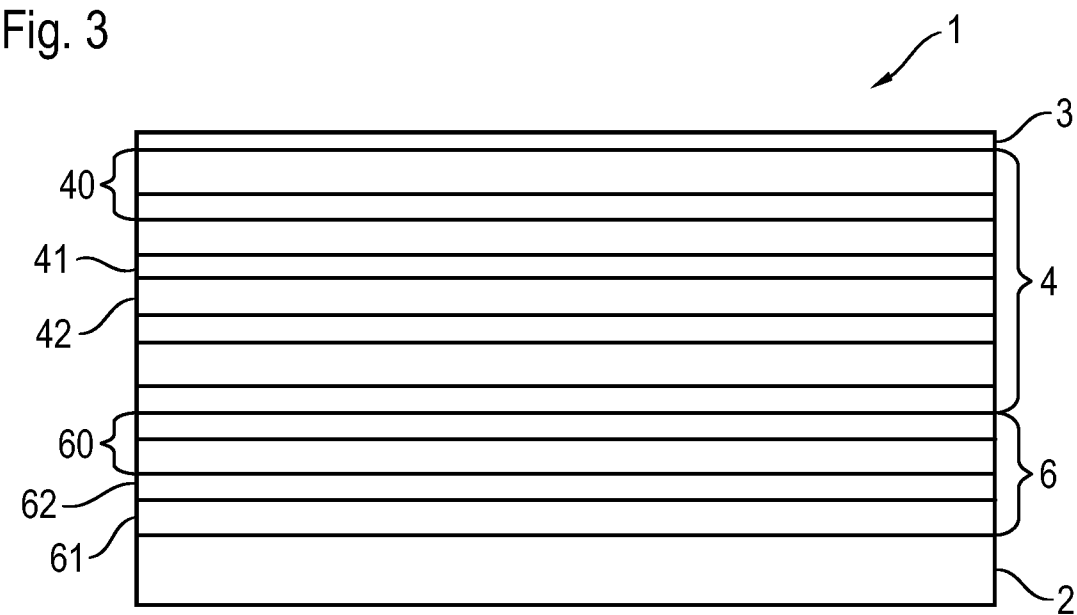

In the embodiment shown in FIG. 3 of a reflective optical element 1, the material of layers 61 is nickel or a nickel alloy, and the thickness is chosen such that the ratio G to the thickness of period 60 is between 0.25 and 0.75.

Taking the above-mentioned example of first multilayer system 4 as a basis, its layer stress can be compensated, for example, by the following second multilayer systems 6, amongst others:

In a first example on the basis of nickel-vanadium as the first material of second multilayer system 6, a period 60 includes a nickel-vanadium layer of 2.7 nm and a silicon layer of 2.7 nm, where 48 periods are needed.

In a second example on the basis of nickel-vanadium as the first material of second multilayer system 6, a period 60 includes a nickel-vanadium layer of 0.5 nm to 4 nm and a molybdenum layer of 0.5 nm to 4 nm, wherein depending on each layer thickness 40 to 70 periods are needed. Layer thicknesses are chosen such that the ratio G is between 0.6 and 0.67.

As a modification of the these two examples, particularly preferred material combinations for second multilayer system 6 are periods including a nickel-silicon layer and a molybdenum layer, a nickel-boron layer and a molybdenum layer, a nickel-molybdenum and a silicon layer, or a nickel-silicon-boron layer and a chromium layer.

In a third example, nickel-vanadium-silicon was the first material of the second multilayer system 6, a period 60 including a nickel-vanadium-silicon layer 61 of 6.0±1.0 nm and a molybdenum layer 62 of 4.0±0.3 nm, wherein depending on each layer thickness 40 to 50 periods are needed for efficient stress compensation. Layer thicknesses are chosen such that the ratio G is between 0.54 and 0.65.

As a modification of this example, the first material may be nickel, nickel-silicon, nickel-boron, nickel-molybdenum or nickel-silicon-boron instead of nickel-vanadium-silicon and the second material may be chromium instead of molybdenum, while having the same layer thicknesses and ratios G as the reflective optical element with a second multilayer based on nickel-vanadium-silicon and molybdenum.

Figure 4:
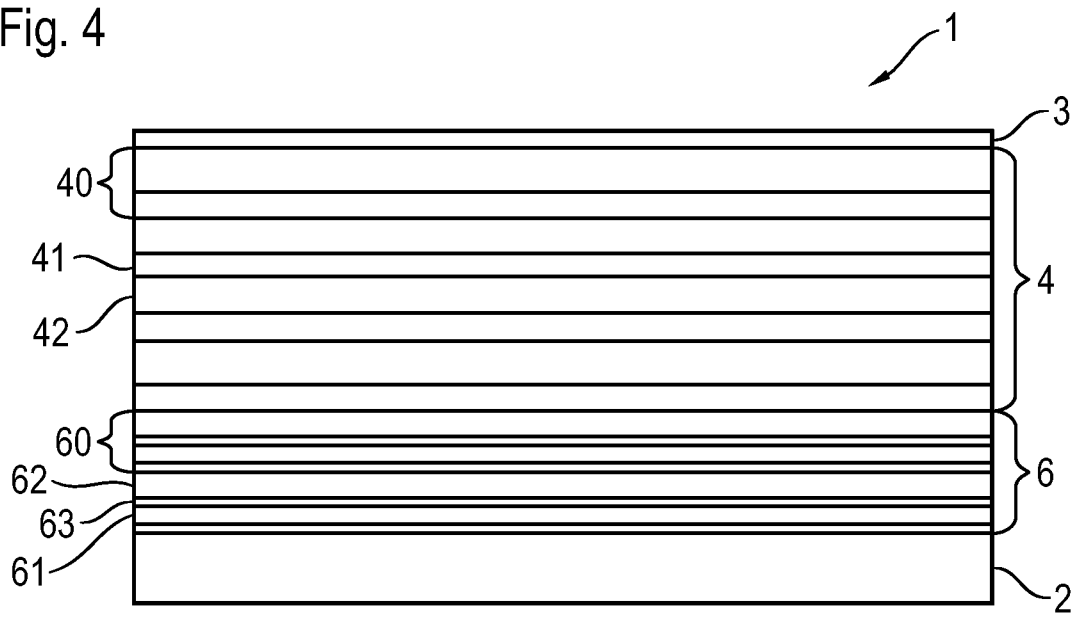

A modification of the embodiment illustrated in FIG. 3 is shown in FIG. 4. Herein, in the second multilayer system 6, intermediate layers 63 are arranged between all layers 61, 62 of multilayer system 6. In further embodiments, they can be exclusively arranged at the interfaces from the absorber to the spacer layer or at the interfaces from the spacer to the absorber layer. The intermediate layers 63 limit compacting of periods 60 when the reflective optical element 1 is operated and is irradiated with soft X-ray or EUV radiation, and are particularly advantageous for mirrors in beam-forming or illumination systems of an EUV lithography apparatus, where the heat load is higher than in the projection system. As a diffusion barrier they can also prevent excessive intermixing of layers 61, 62. Overall, intermediate layers 63 allow better control of the real layer thicknesses within multilayer system 6. Intermediate layers 63 can be applied in a separate coating step. If an ion beam with suitable ions is used, intermediate layers can also be inserted simultaneously with post processing of an absorber or spacer layer, for example during a polishing process.

In one example of many on the basis of nickel or a nickel alloy as the first material of second multilayer system 6, a period 60 includes a nickel-vanadium layer of 2.7 nm, a silicon layer of 2.1 nm, and a carbon layer of 0.5 nm as an intermediate layer 63, where 65 periods are needed, to compensate the layer stress of the above-mentioned multilayer system 4.

In a further example, nickel-vanadium-silicon was the first material of the second multilayer system 6, and a period 60 includes a nickel-vanadium-silicon layer 61 of 6.0±1.0 nm and a molybdenum layer 62 of 4.0±0.3 nm as well as a carbon layer of ca. 0.5 nm, wherein depending on each layer thickness 40 to 50 periods are needed for efficient stress compensation. Layer thicknesses are chosen such that the ratio G is between 0.54 and 0.65.

As a modification of this example, the first material may be nickel, nickel-silicon, nickel-boron, nickel-molybdenum or nickel-silicon-boron instead of nickel-vanadium-silicon, the second material may be chromium instead of molybdenum, and the third material may be boron carbide instead of carbon, while having the same layer thicknesses and ratios G as the reflective optical element with a second multilayer based on nickel-vanadium-silicon, molybdenum and carbon.

Figure 5:
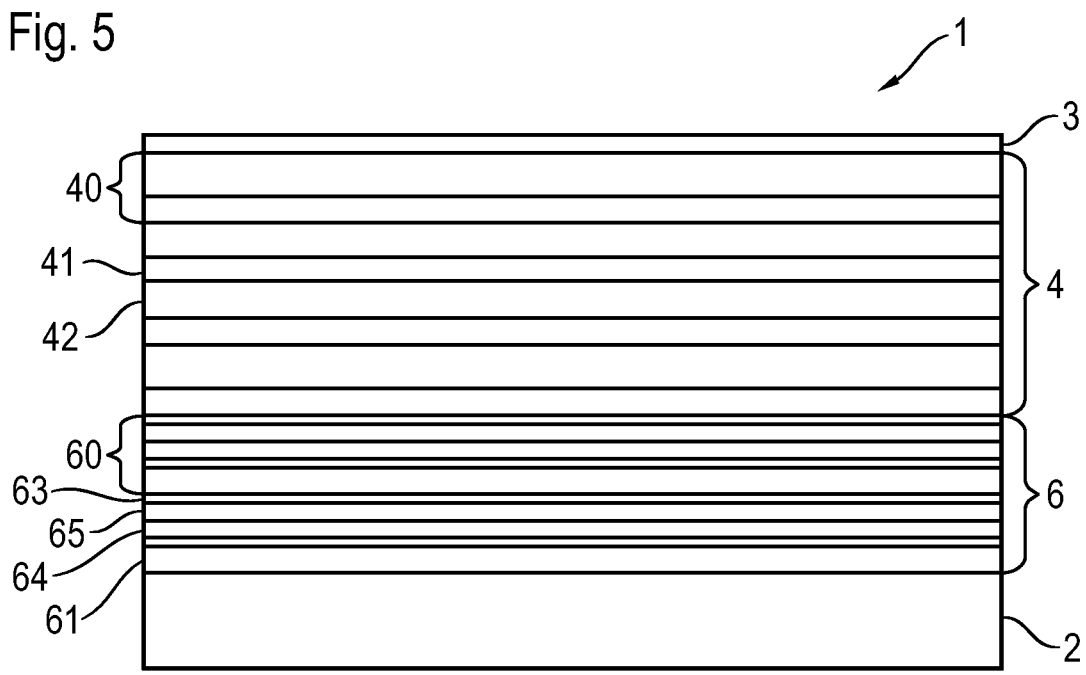

FIG. 5 shows a further exemplary embodiment of a reflective optical element 1. In the example shown here, periods 60 of second multilayer system 6 are comprised of layers 61 of nickel or a nickel alloy and at least two layers 64, 65 of the materials having different real parts of the refractive index at the working wavelength of first multilayer system 4. In the example shown here, layers 64 are of the material of absorber layers 41 and layers 65 are of the material of spacer layers 42. Additionally, intermediate layers 63 are arranged between layers 61 and layers 64 or 65.

In one example of many on the basis of nickel or a nickel alloy of the first material of second multilayer system 6, a period 60 includes a nickel-vanadium layer of 2.7 nm, a carbon layer of 0.5 nm, a molybdenum layer of 2.1 nm, a silicon layer of 0.5 nm to 4 nm, and a carbon layer of 0.5 nm, wherein 80 to 110 periods are needed depending on the thickness of the silicon layer, to compensate the layer stress of the above-mentioned multilayer system 4. In variants, the carbon, in particular, can also be replaced by silicon nitride.

Figure 6:
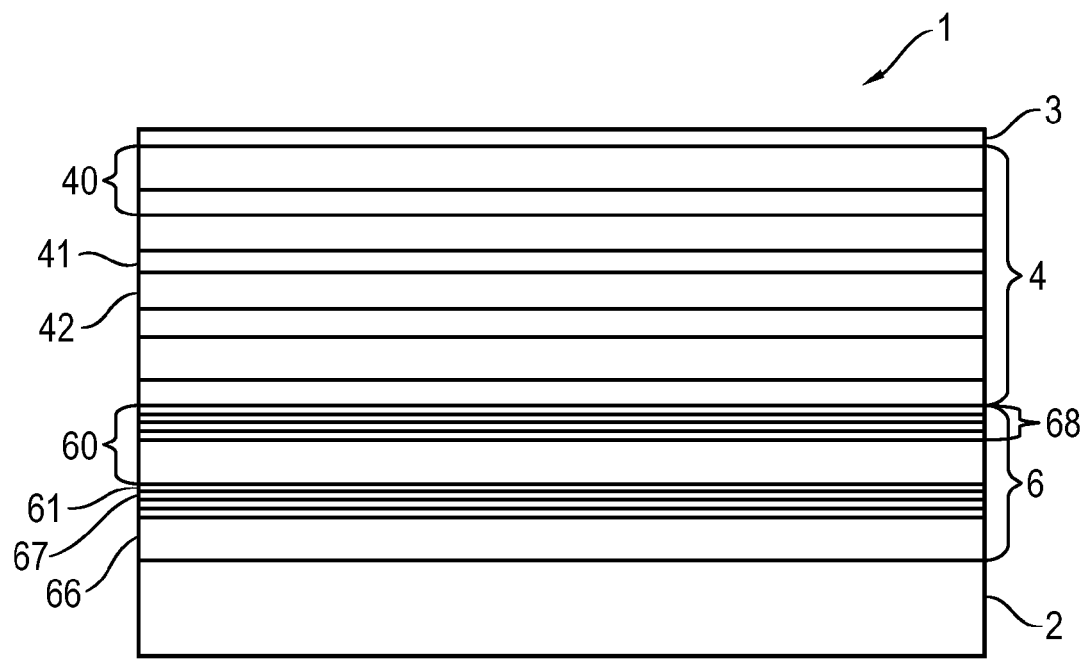

FIG. 6 shows a further exemplary embodiment of reflective optical element 1. In the example shown here, periods 60 of second multilayer system 6 are comprised of periods 68 of nickel or nickel alloy layers 61 and layers 67 of a different material, and of a layer 66 of a third material.

In one example of many on the basis of nickel or a nickel alloy as the first material of second multilayer system 6, a period 60 includes 5 periods 68 of a nickel-vanadium layer of 0.5 nm and a silicon layer of 0.5 nm, and a molybdenum layer of 2.1 nm, wherein 190 periods are needed to compensate the layer stress of the above-mentioned multilayer system 4.

In the examples shown here, the molybdenum- and nickel-containing layers, in particular, were applied by conventional magnetron sputtering. Both the molybdenum layers of 2.1 nm and the nickel-vanadium layers of 2.7 nm or more are present in an amorphous state. Slightly thicker layer thicknesses can also be chosen while still obtaining sufficiently amorphous layers.

It should be noted that, in the above-mentioned examples, nickel or other nickel alloys, such as nickel-silicon, nickel-boron, nickel-molybdenum, or nickel-silicon-boron, could be used instead of nickel-vanadium. These nickel compounds are also present in an amorphous state with thicker layer thicknesses.

Depending on the desired reflective optical element, in particular depending on each layer stress of the reflective first multilayer system 4, the materials and layer thicknesses of the stress-compensating second multilayer system 6 can be varied to obtain the best possible stress compensation.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A reflective optical element operative at a working wavelength in at least one of the soft X-ray and extreme ultraviolet wavelength ranges, comprising:
   a first multilayer system of at least two alternating materials on a substrate,
   wherein real parts of refractive indices of the at least two alternating materials differ at the working wavelength, and
   wherein the first multilayer system exerts a layer stress on the substrate, and
   a second multilayer system comprising two periodically alternating materials on the substrate,
   wherein the second multilayer system exerts an opposed layer stress on the substrate and is arranged between the first multilayer system and the substrate,
   wherein the first material of only the second multilayer system and not the first multilayer system comprises nickel-vanadium-silicon, and
   wherein, within a period of the second multilayer system, the ratio of the overall thickness of the nickel-vanadium-silicon layers to the overall thickness of the period of the second multilayer system is at least 0.25.

2. The reflective optical element according to claim 1, wherein the second multilayer system comprises periods of first layers of nickel-vanadium-silicon and periods of second layers of a further metal.

3. The reflective optical element according to claim 2, wherein the further metal comprises molybdenum or chromium.

4. The reflective optical element according to claim 2, wherein the thickness of the nickel-vanadium-silicon layers is between 4.5 nm and 7.5 nm and the thickness of the further metal layers is between 3.0 nm and 5.0 nm.

5. The reflective optical element according to claim 1, wherein the ratio of the overall thickness of the nickel-vanadium-silicon layers within one period of the second multilayer system to the overall thickness of the period of the second multilayer system is between 0.45 and 0.75.

6. The reflective optical element according to claim 1, wherein the second multilayer system comprises 40 to 50 periods.

7. The reflective optical element according to claim 1, wherein the nickel-vanadium-silicon comprises 33 wt.-% to 50 wt.-% of silicon.

8. The reflective optical element according to claim 1, wherein the nickel vanadium of the nickel-vanadium-silicon comprises between 90 wt.-% and 95 wt.-% nickel, inclusive, and between 10 wt.-% and 5 wt.-% vanadium, inclusive.

9. The reflective optical element according to claim 1, wherein the second multilayer system is comprised of periods of two materials arranged in alternating layers, one of which is nickel-vanadium-silicon, and a layer of a third material.

10. A projection system comprising at least one reflective optical element, according to claim 1.

11. An illumination system comprising at least one reflective optical element according to claim 1.

12. An extreme-ultraviolet (EUV) lithography apparatus comprising at least one reflective optical element according to claim 1.

13. A projection system comprising at least one reflective optical element, according to claim 9.

14. An illumination system comprising at least one reflective optical element according to claim 9.

15. An extreme ultraviolet (EUV) lithography apparatus comprising at least one reflective optical element according claim 9.

16. A reflective optical element operative at a working wavelength in at least one of the soft X-ray and extreme ultraviolet wavelength ranges, comprising:
    a first multilayer system of at least two alternating layers on a substrate,
    wherein real parts of refractive indices of the at least two alternating layers differ at the working wavelength, and
    wherein the first multilayer system exerts a layer stress on the substrate, and
    a second multilayer system comprising two periodically alternating layers on the substrate,
    wherein the second multilayer system exerts an opposed layer stress on the substrate and is arranged between the first multilayer system and the substrate,
    wherein the opposed layer stress is opposed to the layer stress exerted by the first multilayer system,
    wherein a first layer of only the second multilayer system comprises nickel-vanadium-silicon, and
    wherein within a period of the second multilayer system, a ratio of an overall thickness of the nickel-vanadium-silicon layers to an overall thickness of the period of the second multilayer system is at least 0.25.

17. The reflective optical element according to claim 16, wherein the ratio of the overall thickness of each of the nickel-vanadium-silicon layers to the overall thickness of each of the periods of the second multilayer system is between 0.54 and 0.65.

18. The reflective optical element according to claim 16, wherein the thickness of each of the nickel-vanadium-silicon layers is between 4.5 nm and 7.5 nm and the overall thickness of each of the periods of the second multilayer is between 7.5 nm and 12.5 nm.

19. The reflective optical element according to claim 16, wherein the second multilayer system comprises 40 to 50 periods.

20. The reflective optical element according to claim 16, wherein the nickel-vanadium-silicon comprises 33 wt.-% to 50 wt.-% of silicon; and
    wherein the nickel vanadium of the nickel-vanadium-silicon comprises between 90 wt.-% and 95 wt.-% nickel, inclusive, and between 10 wt.-% and 5 wt.-% vanadium, inclusive.

* * * * *

UNITED STATES PATENT AND TRADEMARK OFFICE
CERTIFICATE OF CORRECTION

PATENT NO.        : 8,928,972 B2                                   Page 1 of 1
APPLICATION NO.   : 13/188692
DATED             : January 6, 2015
INVENTOR(S)       : Joern Weber It is certified that error appears in the above-identified patent and that said Letters Patent is hereby corrected as shown below:

In the Claims:
Column 10; Line 43; In Claim 2; after "comprises" delete "periods of".

Column 11; Line 16; In Claim 15; change "according" to -- according to --.

Signed and Sealed this
Eleventh Day of August, 2015

Michelle K. Lee
*Director of the United States Patent and Trademark Office*